United States Patent

Hayakawa

[11] Patent Number: 5,260,959
[45] Date of Patent: Nov. 9, 1993

[54] NARROW BEAM DIVERGENCE LASER DIODE

[75] Inventor: Toshiro Hayakawa, Yokohama, Japan

[73] Assignee: Eastman Kodak Company, Rochester, N.Y.

[21] Appl. No.: 902,212

[22] Filed: Jun. 22, 1992

[30] Foreign Application Priority Data

Feb. 24, 1992 [JP] Japan .................................. 436745

[51] Int. Cl.$^5$ .............................................. H01S 3/19
[52] U.S. Cl. .................................................. 372/45
[58] Field of Search ...................................... 372/45, 46

[56] References Cited

U.S. PATENT DOCUMENTS

| 4,841,533 | 6/1989 | Hayakawa et al. | 372/45 |
| 5,081,634 | 1/1992 | Weisbuch et al. | 372/45 |
| 5,172,384 | 12/1992 | Goronkin et al. | 372/45 |

OTHER PUBLICATIONS

W. T. Tsang, "Semiconductors and Semimetals," vol. 24, pp. 397, Ed. R. Dingle, Academic Press, San Diego (1987).

L. Figueroa, "Handbook of Microwave and Optical Components," vol. 3, Optical Components, pp. 246-252, edited by K. Chang, Wiley-Interscience Publications, New York (1990).

M. C. Wu et al, Applied Physics Letters, vol. 59, p. 1046 (1991).

T. M. Cockerill et al, Applied Physics Letters, vol. 59, p. 2694 (1991).

Primary Examiner—Georgia Y. Epps
Attorney, Agent, or Firm—Raymond I. Owens

[57] ABSTRACT

A high efficiency laser diode that has a narrow beam divergence in a direction perpendicular with respect to the substrate, and a low threshold current.

3 Claims, 4 Drawing Sheets

NARROW BEAM DIVERGENCE LASER DIODE

CROSS-REFERENCE TO RELATED APPLICATION

Reference is made to commonly assigned U.S. Ser. No. 923,763 filed Aug. 3, 1992 entitled "LASER DIODE" by Toshiro Hayakawa, the teachings of which are incorporated herein by reference.

BACKGROUND OF THE INVENTION

1. Field of the Invention

The present invention relates to a laser diode, and more particularly to a laser diode having a narrow beam divergence with improved coupling efficiency with optical systems having optical fiber, lenses and the like.

2. Description of the Prior Art

In recent years optical communication technology and optical information processing are playing major roles in various fields. Digital optical communication using optical fibers has made possible large increases in data communication densities, and optical disks and laser printers have produced a considerable expansion of the range of optical information processing applications. The progress of optical communications and optical information processing technology owes much to advances made in the laser diodes used as light sources. The small size and high efficiency that are features of laser diodes have brought these devices into widespread use, for example as light sources for compact disk systems, video disk systems and optical communication networks. In a laser diode the lasing action is generated by the injection of carriers into the P-N junction constituting the active layer. Recent advances in semiconductor technology such as MBE (molecular beam epitaxy) and MOCVD (metal-organic chemical vapor deposition) that make it possible to form epitaxial layers as thin as 1 nm or less, have led to the realization of laser diodes that use quantum well active layers less than 20 nm thick, with higher levels of efficiency and lower drive current requirements (see W. T. Tsang in "Semiconductors and Semimetals," vol. 24, pp 397, Ed. R. Dingle, Academic Press, San Diego (1987)).

Compared to gas lasers or ordinary solid-state lasers, the major feature of laser diodes is their small size and high efficiency. However, when incorporated into an actual system the laser beam has to be coupled with some form of optical system. Viewed from the system side the problem concerns the overall characteristics of the laser diode, including the coupling characteristics relative to the optical system. In general it is difficult to achieve high coupling efficiency owing to the beam having a wide beam divergence of 30 degrees or more and, rather than being isotropic, having a spatial asymmetry of 1:2 to 1:3 or more. Especially in recent years, when used as excitation sources for optical fiber amplifiers in communication systems or to excite solid-state lasers, high optical-coupling efficiency into a small region is becoming increasingly important. Also, in such applications as these in which high output power is required, a low coupling efficiency has to be offset by raising the optical output power of the laser diode accordingly, which lowers the reliability of the laser diode and, therefore, the reliability of the whole system.

The structure of a laser diode is a multilayer arrangement of semiconductor material formed by epitaxially growing the operating layers, including an optical waveguide layer structure, on a substrate. Such a structure results in a large refractive index change along a direction perpendicular to the substrate which, with the different layers, produces a strong optical confinement effect, so that when the light spot diameter is 1 μm or less the diffraction effect gives rise to a large beam divergence angle of 20 to 30 degrees or more. In contrast, in a direction parallel to the substrate, in nearly all cases other than buried structures the optical confinement is the result of the equivalent of changes in the index of refraction based on the differences in propagation constant produced by changes in the thickness of the layers, and as such the confinement effect is weak. Moreover, the waveguide structure is fabricated mainly using a photolithographic fabrication process that produces a waveguide width in the order of 2 to 5 μm, and as a result the spot diameter increases to around the same size and, also, the weak diffraction causes a narrowing of the beam divergence angle to around 10 degrees or less. (See L. Figueroa in "Handbook of Microwave and Optical Components," vol. 3, Optical Components, pp 246-252, edited by K. Chang, Wiley-Interscience Publications, New York (1990)

In order to improve the coupling efficiency between the diode and the optical system, first it is important reduce the beam divergence along the direction perpendicular to the substrate. Generally this is done by reducing the thickness of the layers adjacent to the active region that have a high index of refraction, causing the light to penetrate into the low-refractive-index cladding regions around the beam and increasing the diameter of the light spot. However, the result of this is that the quantity of photons confined in the active layer is reduced by the amount by which the beam size is increased, thereby reducing the confinement factor and increasing the threshold current needed for oscillation to take place. In particular, in the case of quantum well active layer decrease in the confinement factor caused by the rapid saturation of the gain that accompanies an increase in injection carriers produces a considerable increase in the threshold current. While there is a method of compensating for this gain saturation by optimizing the number of quantum wells at around two or three, the threshold current increases with the increase in the number of quantum wells.

To overcome the drawbacks of conventional laser diodes described above, a laser diode has been proposed in which the cladding is a multilayer structure having a periodic refractive index differential (see M. C. Wu, et al., Applied Physics Letters, vol. 59, page 1046 (1991)). This PINSCH (for Periodic Index Separate Confinement Heterostructure) laser uses the same principle as a λ/4 shift DFB laser to prevent high-order mode oscillation from taking place even when there is an increase in beam diameter in the perpendicular direction. However, the drawback of this structure is that fabricating each of the layers making up the periodic index cladding structure requires high-precision control of layer composition and thickness, and in addition there has to be a gradual change in layer composition at the interfaces between layers in order to suppress increases in electrical resistance that can give rise to energy barriers in the multilayer structure. Another method involves reducing beam divergence by the addition to the waveguide region of layers having a lower refractive index (see T. M. Cockerill et al., Applied Physics Letters, vol. 59, page 2694 (1991)). However, tests on beam divergence in the perpendicular direction produced a full-width at half maximum of 27 degrees and a threshold current density of 309 Å/cm² (with a resonator length of 780 μm), inferior to an ordinary quantum well laser beam divergence angle of 35 degrees and threshold current density of 200 Å/cm².

SUMMARY OF THE INVENTION

An object of the present invention is therefore to provide a high efficiency laser diode that has a narrow beam divergence in the perpendicular direction and low threshold current.

In accordance with the present invention, the above object is attained by a multilayer laser diode comprising:

an optical waveguide region having a quantum well layer and at least one high refractive index layer on each side of the quantum well layer;

upper and lower cladding regions respectively on each side of the optical waveguide region and having one or more low refractive index layers and one or more layers having an even lower refractive index;

a lower buffer layer adjacent to the lower cladding region;

a cap layer for providing an electrode and positioned adjacent to the upper cladding region; and the energy of the lasing light of the laser diode being selected to be lower than the energy gap of the cap layer and lower buffer layer that are adjacent to the cladding regions.

In the laser diode thus structured in accordance with this invention band-to-band absorption in layers located on the outer side of the cladding layers is prevented which, by thereby eliminating loss caused by such absorption, results in a low threshold current combined with narrow beam divergence.

Further features of the invention, its nature and various advantages will be more apparent from the accompanying drawings and following detailed description of the invention.

DESCRIPTION OF THE PREFERRED EMBODIMENT

Figure 1:
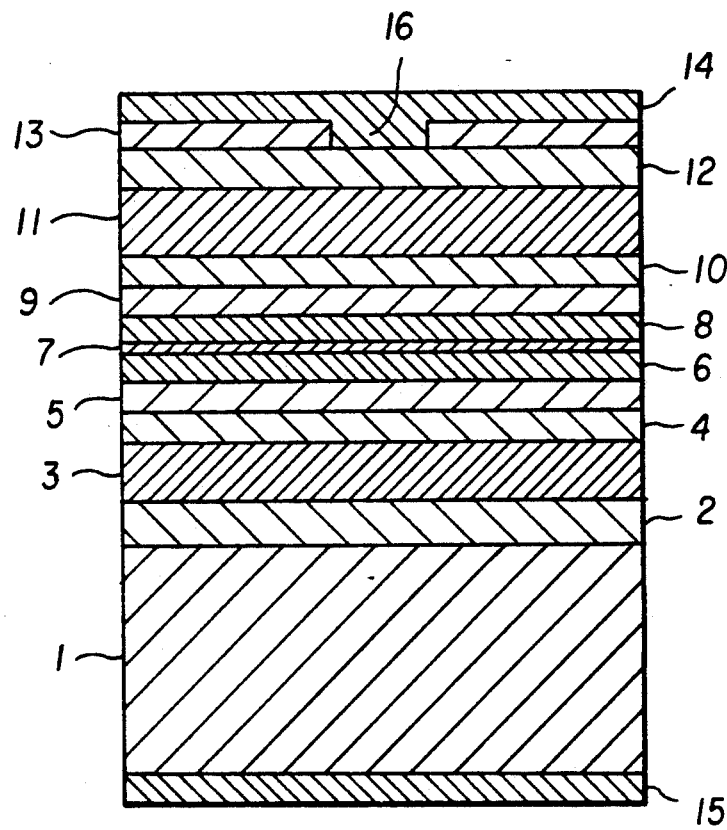
FIG. 1 is a cross-sectional view of a laser diode according to a first embodiment of the invention.

FIG. 1 is a cross-sectional view of an InGaAs/GaAs/AlGaAs strained quantum well laser according to a first embodiment of the invention. With reference to the drawing, molecular beam epitaxy (MBE) was used to form an n-GaAs buffer layer 2 (Si=1×10¹⁸cm⁻³, 0.7 μm thick) on an n-GaAs substrate 1 (Si=2×10¹⁸ cm⁻³) with a (100) orientation, and this was followed by the formation of an n-Al$_{0.3}$Ga$_{0.7}$As cladding layer 3 (Si=1×10¹⁸cm⁻³, 1.5 μm thick), an n-Al$_{0.6}$Ga$_{0.4}$As low refractive index layer 4 (Si=1×10¹⁸cm⁻³, 0.2 μm thick), an n-Al$_{0.3}$Ga$_{0.7}$As cladding layer 5 (Si=1×10¹⁸cm⁻³, 0.1 μm thick), a non-doped GaAs optical waveguide layer 6 (0.06 μm thick), a non-doped In$_{0.2}$Ga$_{0.8}$As strained quantum well layer 7 (0.006 μm thick), a non-doped GaAs optical waveguide layer 8 (0.06 μm thick), a pAl$_{0.3}$Ga$_{0.7}$As cladding layer 9 (Be=1×10¹⁸cm⁻³, 0.1 μm thick), a p-Al$_{0.6}$Ga$_{0.4}$As low refractive index layer 10 (Be=1×10¹⁸cm⁻³, 0.2 μm thick), a p-Al$_{0.3}$Ga$_{0.7}$As cladding layer 11 (Be=1×10¹⁸cm⁻³, 1.5 μm thick), and a p-GaAs cap layer 12 (Be=1×10¹⁹cm⁻³, 0.5 μm thick). The AlGaAs and InGaAs each have a different optimum growth temperature, so the following heating program was used.

The growth of the n-GaAs buffer layer 2 is started at 620° C. and proceeds for 0.3 μm, and during the growth of the next 0.3 μm the temperature is gradually raised to 720° C. for a further 0.1 μm layer of growth. Then the layers from the n-Al$_{0.3}$Ga$_{0.7}$As cladding layer 3 to n-Al$_{0.3}$Ga$_{0.7}$As cladding layer 5 are grown at 720° C., and during growth of the non-doped GaAs optical waveguide layer 6 the temperature is gradually lowered to 500° C., and the non-doped In$_{0.2}$Ga$_{0.8}$As strained quantum well layer 7 is grown.

Next, during the growth of the non-doped GaAs optical waveguide layer 8 the temperature was again gradually raised to 720° C. to grow the layers from the non-doped Al$_{0.3}$Ga$_{0.7}$As cladding layer 9 to the p-GaAs cap layer 12. Thereby fabricating the materials under the respective optimum conditions of a higher temperature for the AlGaAs and a lower temperature for the InGaAs makes it possible to realize good crystallinity. To change the temperature without interrupting the growth process, the growth temperature was changed during formation of a GaAs layer, which has a lower growth temperature dependency than other layers, thereby preventing the boundary degradation that accompanies interruption of the growth process. Moreover, to avoid defects during the MBE process such as stress-induced slip lines, the n-GaAs substrate was affixed to the holder by mechanical means rather than by In solder.

A SiN$_x$ layer 13 (3000 nm thick) was then formed by means of plasma CVD, and photolithography together with chemical etching using dilute HF were then used to remove part of the SiN$_x$ layer so as to form a window strip 16 50 μm wide. To finish, vacuum deposition was used to form a Mo/Au electrode layer 14 on the p-GaAs cap layer side and a AuGe/Ni/Au electrode layer 15 on the n-GaAs substrate side, which was followed by annealing at 460° C. for five minutes to form ohmic electrodes.

The wafer thus fabricated was cleaved to form a resonator 500 μm long, and electron-beam deposition was then used to provide the front end with an Al$_2$O$_3$ coating having a reflectance of 10% and the rear end with a multilayer coating of 95%-reflectance Al$_2$O$_3$ followed by amorphous silicon, this sequence being then repeated. The wafer was then cut into chips 500 μm wide which were then each In-soldered onto a copper heat sink and the characteristics were measured. At 25° C. the device oscillated at a threshold current of 60 mA, producing an optical output of 500 mW from the front end; oscillation wavelength was around 975 nm. Far-field image measurement from the front end showed a full-width at half maximum of around 17 degrees in the perpendicular direction, which is very small for this wave band. Horizontally, because of the multimode operation the far-field image had multiple peaks and a full-width at half maximum of around 10 degrees. Here, by inserting the Al$_{0.6}$Ga$_{0.4}$As low refractive index layers 4 and 10 between p- and n-type $Al_{0.3}Ga_{0.7}As$ cladding layers to control electrical field distribution within the optical waveguide, and using an $In_{0.2}Ga_{0.8}As$ strained quantum well layer as the active layer and GaAs for the substrate, buffer and cap layers, a GaAs energy gap of 1.424 eV is realized that is higher than the lasing light energy of 1.265 eV, band-to-band in these layers is eliminated, producing a low threshold current.

Figure 2A:
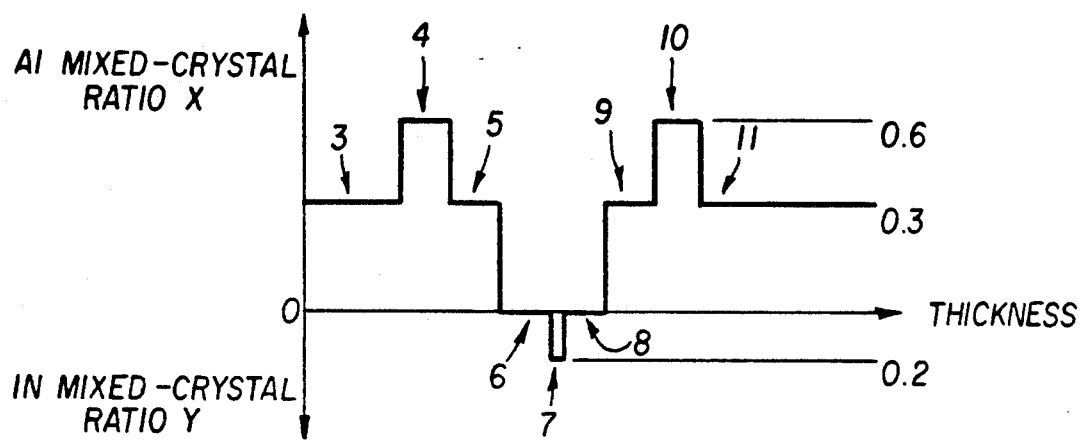
FIGS. 2A-2B is a diagram showing the distribution of the mixed crystal layers in the thickness direction of the laser diode of the first embodiment.
Figure 2B:
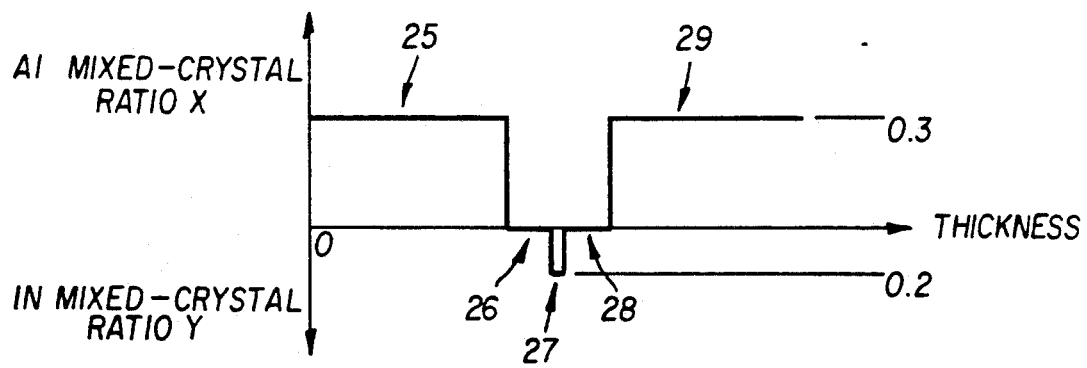
Figure 3:
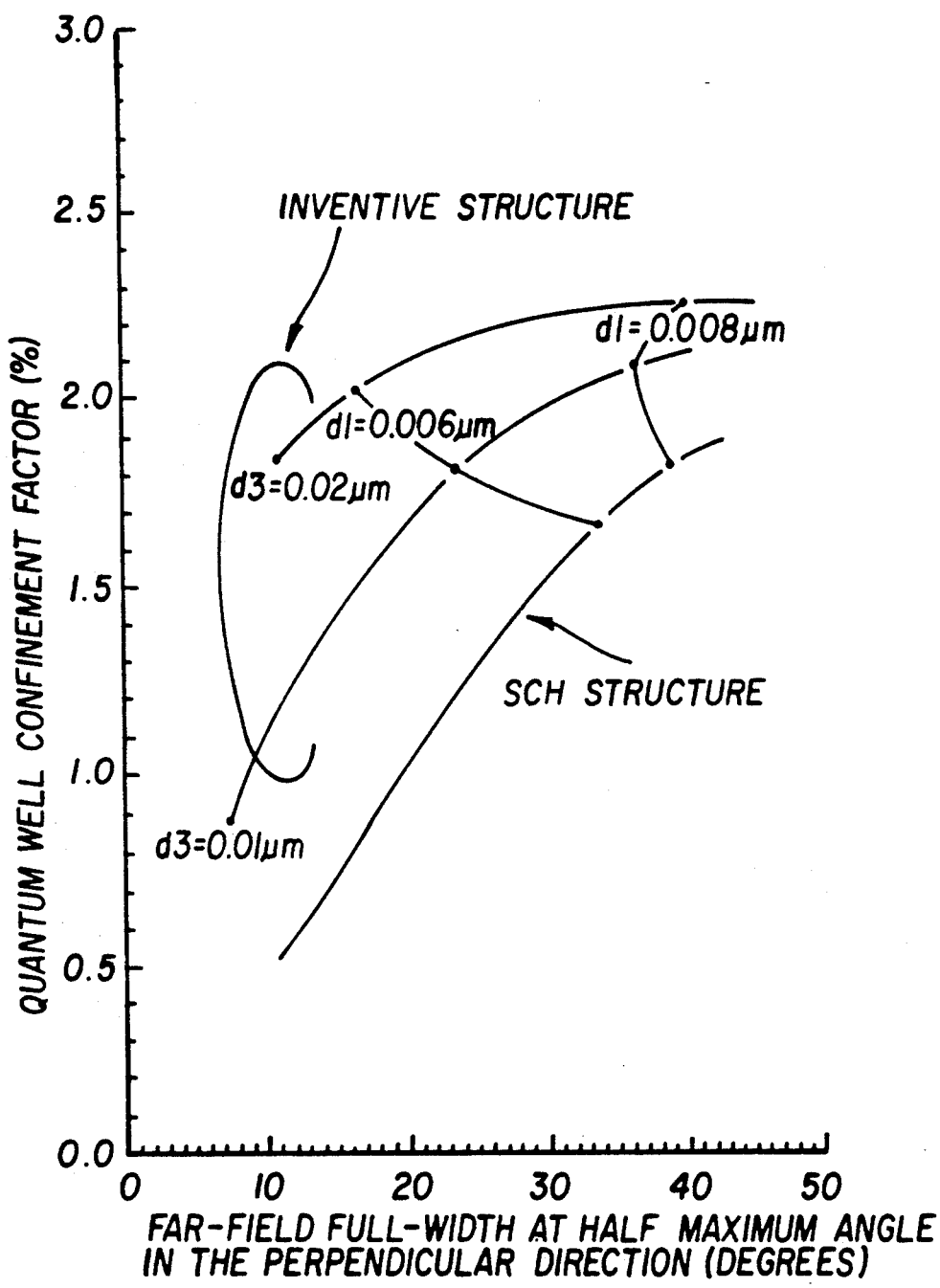
FIG. 3 is a graph of the optical confinement factor of the first embodiment.

The invention will now be described with reference to theoretical calculations. FIG. 2(A) shows the distribution in the thickness direction of the Al component ratio x in the $Al_xGa_{1-y}As$ layers and the In component ratio y in the $In_yGa_{1-y}As$ layers. For comparison, FIG. 2(B) shows the mixed-crystal ratio distribution of an ordinary SCH laser, based on calculated values. These values were calculated assuming an infinitely large thickness for the cladding layers 3, 11, 25 and 29. FIG. 3 shows the results obtained by calculating the InGaAs quantum well confinement factor as a function of the full-width at half maximum of the far-field image in the perpendicular direction. For the calculations, the thickness of the InGaAs quantum well layers 7 and 27 was assumed to be a constant 0.006 μm and the thickness of the $Al_{0.6}Ga_{0.4}As$ low refractive index layers 4 and 10 in the arrangement of the invention shown in FIG. 2(A) a constant 0.1 μm, and the thickness d2 of the cladding layers 5 and 9 0.01 and 0.02 μm. When the thickness d1 of the GaAs optical waveguide layers 6, 8, 26 and 28 is changed, the confinement factor and the far-field broadening angle both decrease by an amount that corresponds to the degree by which the thickness d1 decreases, but compared to a conventional SCH arrangement it can be seen that when low refractive index layers are inserted, for the same broadening angle a higher confinement factor is obtained.

Figure 4:
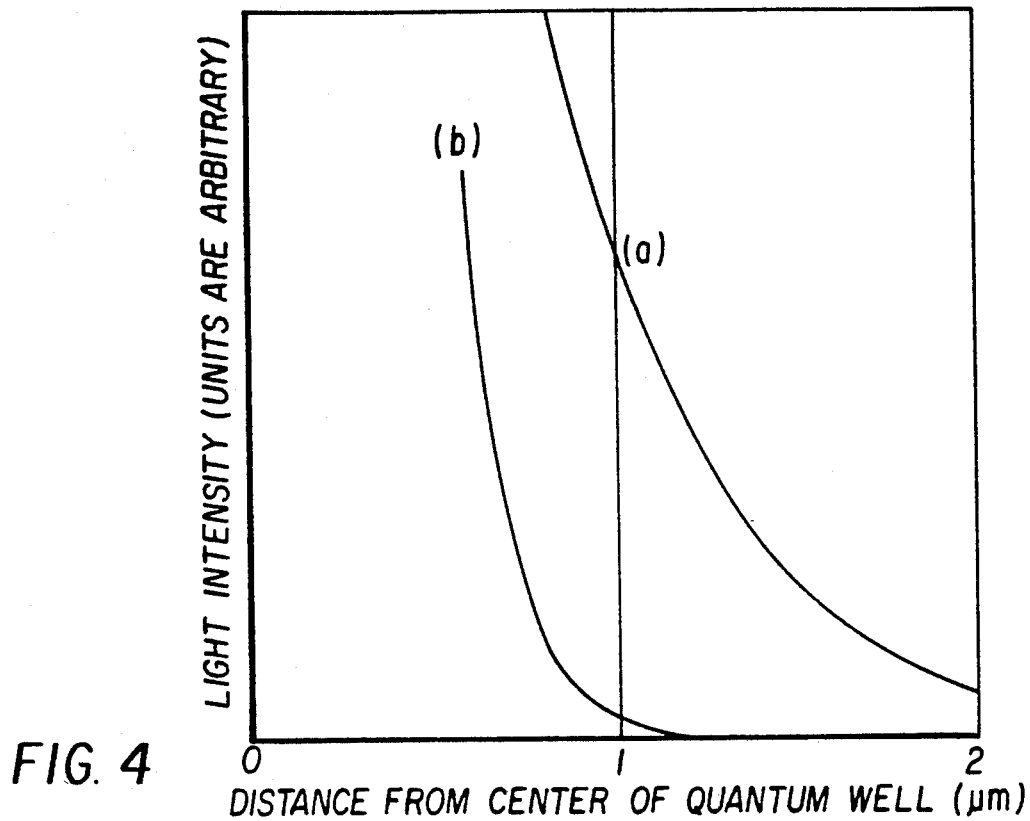
FIG. 4 is a graph of the relationship between light intensity and distance.

FIG. 4 shows the distribution of light intensity obtained with the structure of FIG. 2(A) in which d1 is 0.006 μm and d3 is 0.02 μm (denoted in the FIG. by (a)), and the SCH arrangement or FIG. 2(B) in which d1 is 0.008 μm (denoted in the FIG. by (b)). As the distribution is symmetrical on each side of the quantum well, only one half is shown, from the center of the quantum well. In an ordinary SCH arrangement considerable attenuation takes place in the cladding layers, becoming virtually total at a distance of 1 to 1.5 μm, but inserting the low refractive index layering, as shown by (a), retards the attenuation so that even at a point 1 or 2 μm away from the quantum well there is still a fair level of light intensity. In FIG. 4, at a distance of 1 μm light intensity (a) is 26 times (b), rising to 8900 times at 2 μm. This means that there is no problem in the case of the infinitely large cladding layers used for the calculations. However, in the case of an actual device, buffer layers are formed on a substrate, and this is followed by cladding, an active layer, more cladding and a cap layer for the ohmic electrode. Therefore, when the layers adjacent to these cladding layers have a high absorption coefficient with respect to the laser light and the intensity of the light is high, as in (a) of FIG. 4, in the waveguide mode there will be a high absorption loss, increasing the threshold current and reducing the differential quantum efficiency. In the case of AlGaAs lasers, the most widely used type, because the buffer layers and cap layer are of GaAs which has an energy gap of 1.424 eV (which converts to a wavelength of 870 nm), the smallest within the AlGaAs, except when a relatively thick layer of GaAs is used as the active layer, the laser light will be absorbed through band-to-band transitions. In the case of a conventional separate confinement heterostructure laser such as that of FIG. 4 (a) or a double heterostructure laser, there is no problem since in the cladding layers the light intensity (electrical field strength) is attenuated to a high degree. In accordance with this invention, absorption loss is suppressed by the addition to the cladding layers of a layer having a lower refractivity and by using buffer and cap layers having an energy gap that is larger than the energy of the lasing light. The embodiment described above uses an InGaAs quantum well active layer having a lower oscillation energy than the energy gap of the GaAs buffer and cap layers.

Figure 5:
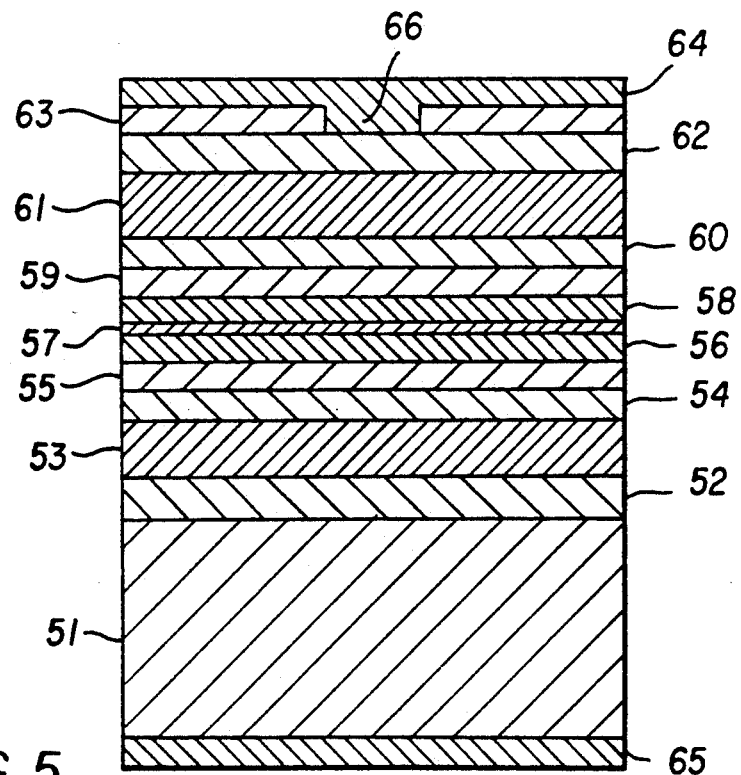
FIG. 5 is a cross-sectional view of a laser diode device.

FIG. 5 is a cross-sectional view of an InGaAs/GaAs/AlGaAs strained quantum well laser according to a second embodiment of the invention. With reference to the drawing, MOCVD was used to form an n-$In_{0.5}Ga_{0.5}P$ buffer layer 52 ($Si=1\times10^{18}cm^{-3}$, 1.0 μm thick) on an n-GaAs substrate 51 ($Si=2\times10^{18}$ cm$^{-3}$) with a (100) orientation, and this was followed by the formation of an n-$Al_{0.45}Ga_{0.55}As$ cladding layer 53 ($Si=1\times10^{18}cm^{-3}$, 1.5 μm thick), an n-$Al_{0.7}Ga_{0.3}As$ low refractive index layer 54 ($Si=1\times10^{18}cm^{-3}$, 0.1 μm thick), an n-$Al_{0.45}Ga_{0.55}As$ cladding layer 55 ($Si=1\times10^{18}cm^{-3}$, 0.1 μm thick), a non-doped $Al_{0.2}Ga_{0.8}As$ optical waveguide layer 56 (0.059 μm thick), a non-doped GaAs quantum well layer 57 (0.007 μm thick), a non-doped $Al_{0.2}Ga_{0.8}As$ optical waveguide layer 58 (0.059 μm thick), a p-$Al_{0.45}Ga_{0.55}As$ cladding layer 59 ($Zn=1\times10^{18}cm^{-3}$, 0.1 μm thick), a p-$Al_{0.7}Ga_{0.3}As$ low refractive index layer 60 ($Zn=1\times10^{18}cm^{-3}$, 0.1 μm thick), a p-$Al_{0.45}Ga_{0.55}As$ cladding layer 61 ($Zn=1\times10^{18}cm^{-3}$, 1.7 μm thick), and a p-$In_{0.5}Ga_{0.5}P$ cap layer 62 ($Zn=1\times10^{19}cm^{-3}$, 0.8 μm thick). This was followed by the same processes used in the first embodiment to form a single mode laser.

In this embodiment, the lasing wavelength of 840 nm (1.476 eV) is so much smaller than the some 1.9 eV energy gap of the buffer and cap layer $In_{0.5}Ga_{0.5}P$ that band-to-band absorption can be ignored. With this embodiment it is possible to realize a far-field full-width at half maximum of 30 degrees or less in the perpendicular direction while maintaining the low threshold current density of 250 Å/cm² of the quantum well laser.

It is to be understood that the present invention is not limited to a laser diode formed on a GaAs substrate as used in the embodiments described above, and that for example an InP substrate may be used. In such a case, the basic mixed crystal is divided broadly into $In_xGa_{1-x}As_yP_{1-y}$ and $(Al_xGa_{1-x})_yIn_{1-y}As$. In either case, if InP is used for the buffer and cap layers, for example, the energy gap of 1.35 eV (in terms of wavelength, 918 nm) thereof would be sufficient for the lower practical lasing wavelength region of 1100 to 1600 nm.

Again, while the above description related to the addition of one low refractive index layer, it to be understood that it is also possible to use a superlattice type structure comprised of alternating layers of GaAs (0.9 nm thick) and AlAs (1.5 nm thick) instead of the $Al_{0.6}Ga_{0.4}As$ layer, and multilayer structures may also be employed for the cladding and other layers.

Moreover, although the above description was made with reference to a device of just the simplest type of electrode stripe arrangement, it is to be understood that the invention may be applied to various other mode structures including various refractive index waveguide structures.

The invention has been described in detail with particular reference to a certain preferred embodiment thereof, but it will be understood that variations and modifications can be effected within the spirit and scope of the invention.

What is claimed is:

1. A multilayer laser diode comprising:
    an optical waveguide region having a quantum well layer and at least one high refractive index layer on each side of the quantum well layer,
    upper and lower cladding regions respectively on each side of the optical waveguide region, each such region having a first low refractive index layer adjacent to the high refractive index layer and a second refractive index layer formed adjacent to a first low refractive index layer and having an even lower refractive index than such first low refractive index layer;
    a lower buffer layer adjacent to the lower cladding region;
    a cap layer for providing an electrode and positioned adjacent to the cladding region; and
    the energy of the lasing light of the laser diode being selected tob e lower than the energy gap of the cap layer and lower buffer layer that are adjacent to the cladding regions.

2. The laser diode of claim 1 wherein the buffer and cap layers are made from GaAs and the quantum well layer is InGaAs.

3. The laser diode of claim 1 wherein the buffer and cap layers are made from InGaP and the quantum well layer is GaAs.

* * * * *